(12) United States Patent
Rakshit et al.

(10) Patent No.: US 12,683,535 B2
(45) Date of Patent: Jul. 14, 2026

(54) PIEZOELECTRIC AND THERMOELECTRIC SOLAR PANEL ASSEMBLY

(71) Applicant: International Business Machines Corporation, Armonk, NY (US)

(72) Inventors: Sarbajit Kumar Rakshit, Kolkata (IN); Jagabondhu Hazra, Bangalore (IN); Manikandan Padmanaban, Chennai (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 97 days.

(21) Appl. No.: 18/947,414

(22) Filed: Nov. 14, 2024

(65) Prior Publication Data

US 2026/0142606 A1 May 21, 2026

(51) Int. Cl.
*H02S 10/10* (2014.01)
*H02N 2/18* (2006.01)
*H10N 10/17* (2023.01)

(52) U.S. Cl.
CPC ............. *H02S 10/10* (2014.12); *H02N 2/186* (2013.01); *H10N 10/17* (2023.02)

(58) Field of Classification Search
CPC ......... H02S 10/10; H10N 10/17; H02N 2/186
See application file for complete search history.

(56) References Cited

U.S. PATENT DOCUMENTS

| | | |
|---|---|---|
| 2015/0083196 A1 | 3/2015 | Gray et al. |
| 2023/0140254 A1 | 5/2023 | Kim et al. |
| 2024/0195349 A1 | 6/2024 | Rakshit et al. |

OTHER PUBLICATIONS

Darren Quick, "Harvesting energy from insects in quest to create tiny cyborg first responders", [online], Retrieved from the Internet :<URL: https://newatlas.com/insect-cyborgs/20596/>. (Year: 2011).*
Zabek et al., "Solid State Generators and Energy Harvesters for Waste Heat Recovery and Thermal Energy Harvesting", Thermal Science and Engineering Progress 9 (2019), pp. 235-247.

* cited by examiner

*Primary Examiner* — Tae-Sik Kang
(74) *Attorney, Agent, or Firm* — Tihon Poltavets

(57) ABSTRACT

A piezoelectric and thermoelectric solar panel assembly includes a solar panel, a cold mirror, and a support panel. The piezoelectric and thermoelectric solar panel assembly also includes piezoelectric generator assembly disposed between the cold mirror and the support panel. The piezoelectric and thermoelectric solar panel assembly further includes a thermoelectric power generation module beneath the cold mirror.

20 Claims, 5 Drawing Sheets

100

PIEZOELECTRIC AND THERMOELECTRIC SOLAR PANEL ASSEMBLY

BACKGROUND

This disclosure relates generally to solar panels, and in particular to solar panel assemblies with piezoelectric and thermoelectric integration.

A solar panel is an assembly of photovoltaic cells configured in a framework to utilize sunlight to generate electrical energy. A solar panel, often referred to as a photovoltaic module, includes a number of photovoltaic cells capable of converting the energy of light directly into electricity via the photovoltaic effect. A thermoelectric generator is a solid state device capable of generating electrical energy based on a temperature difference between electrically conductive material. A piezoelectric generator produces electrical energy by harvesting forces, such as, vibrations induced into a dielectric material that enables a direct conversion between electrical and elastic energy. A cold mirror is a dielectric mirror capable of reflecting visible light on the electromagnetic spectrum, while allowing infrared and ultraviolet wavelengths on the electromagnetic spectrum to passthrough.

SUMMARY

One aspect of an embodiment of the present invention discloses an apparatus for a piezoelectric and thermoelectric solar panel assembly, the apparatus comprising a solar panel, a cold mirror, and a support panel. The piezoelectric and thermoelectric solar assembly further comprising a piezoelectric generator assembly disposed between the cold mirror and the support panel. The piezoelectric and thermoelectric solar further comprising a thermoelectric power generation module beneath the cold mirror.

DETAILED DESCRIPTION

Figure 1:
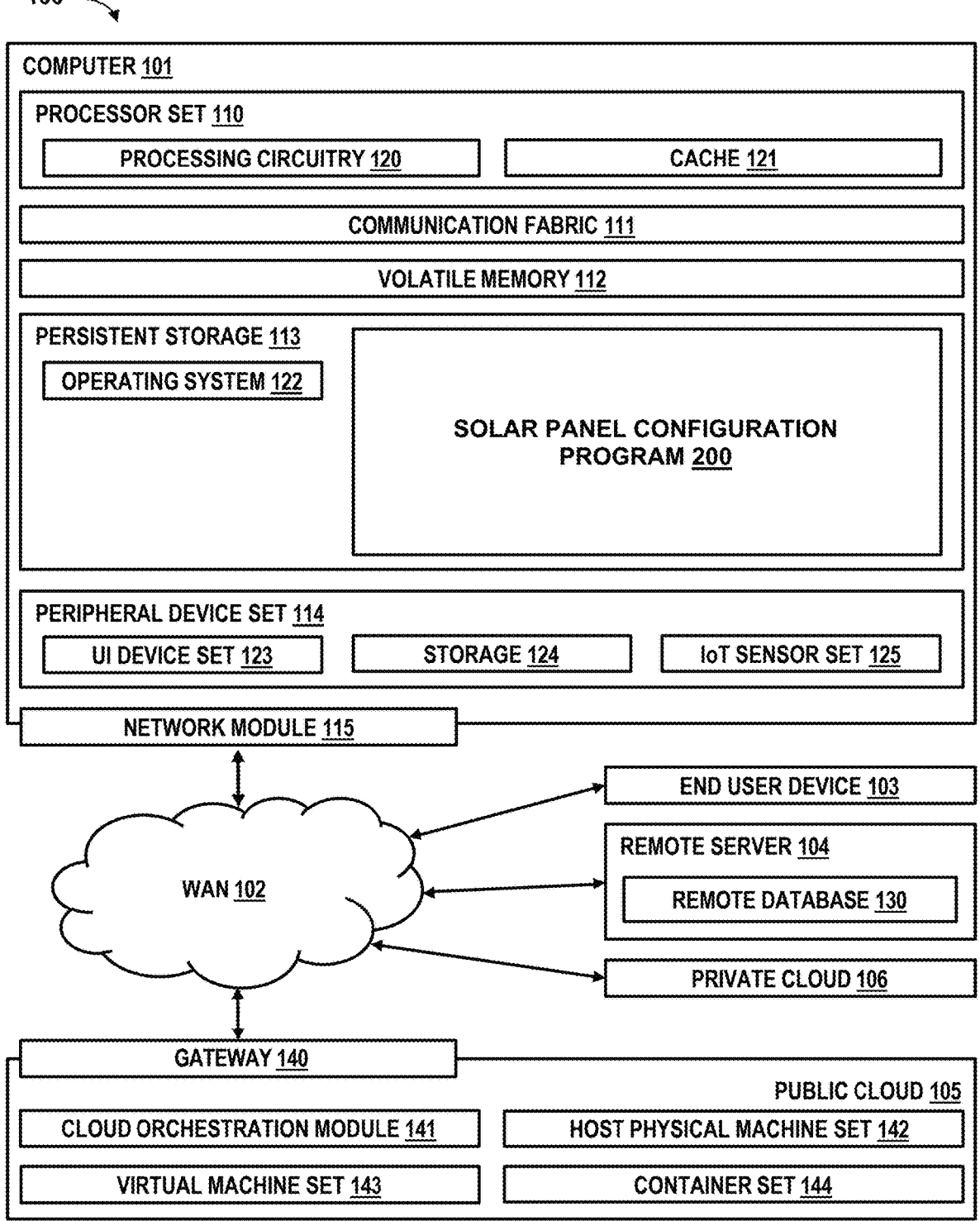
FIG. 1 is a functional block diagram illustrating a computing environment, in accordance with an embodiment of the present invention.

Embodiments of the present invention provide an apparatus for a piezoelectric and thermoelectric solar panel assembly that includes a solar panel coupled and hinged to a cold mirror for directing visible light towards the solar panel. The cold mirror is coupled to a support panel via multiple piezoelectric generator assemblies (e.g., piezoelectric spring) with a thermoelectric generator positioned beneath the cold mirror to capture infrared and/or ultraviolet frequency waves that passthrough the cold mirror. The piezoelectric generator assemblies generate electrical energy through vibrations caused by a wind flow that impacts the cold mirror when the cold mirror is directing visible light towards the solar panel. The thermoelectric generator generates electrical energy by capturing infrared and/or ultraviolet frequency waves passing through the cold mirror. Embodiments of the present invention can alter an angle between the cold mirror and the solar panel of the piezoelectric and thermoelectric solar panel assembly to maximize overall combined energy output, while minimizing heat generated on the surface of the solar panel and minimizing an area of a shadow profile created by the piezoelectric and thermoelectric solar panel assembly. Embodiments of the present invention can further rotate the piezoelectric and thermoelectric solar panel assembly to direct the cold mirror towards the light source to optimize a path of the visible light rays being reflected towards the solar panel.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments. It is to be understood that the singular forms "a," "an," and "the" include plural referents unless the context clearly dictates otherwise. Thus, for example, reference to "a component surface" includes reference to one or more of such surfaces unless the context clearly dictates otherwise.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

FIG. 1 is a functional block diagram illustrating a computing environment, generally designated 100, in accordance with one embodiment of the present invention. FIG. 1 provides only an illustration of one implementation and does not imply any limitations with regard to the environments in which different embodiments may be implemented. Many modifications to the depicted environment may be made by those skilled in the art without departing from the scope of the invention as recited by the claims.

Computing environment 100 contains an example of an environment for the execution of at least some of the computer code involved in performing the inventive methods, such as, solar panel configuration program 200. In addition to solar panel configuration program 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and solar panel configuration program 200, as identified above), peripheral device set 114 (including user interface (UI) device 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

Computer 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

Processor set 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in solar panel configuration program 200 in persistent storage 113.

Communication fabric 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

Persistent storage 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in solar panel configuration program 200 typically includes at least some of the computer code involved in performing the inventive methods.

Peripheral device set 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

Network module 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End User Device (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

Remote server 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

Public cloud 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economics of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Cloud computing services and/or microservices (not separately shown in FIG. 1): private and public clouds 106 are programmed and configured to deliver cloud computing services and/or microservices (unless otherwise indicated, the word "microservices" shall be interpreted as inclusive of larger "services" regardless of size). Cloud services are infrastructure, platforms, or software that are typically hosted by third-party providers and made available to users through the internet. Cloud services facilitate the flow of user data from front-end clients (for example, user-side servers, tablets, desktops, laptops), through the internet, to the provider's systems, and back. In some embodiments, cloud services may be configured and orchestrated according to as "as a service" technology paradigm where something is being presented to an internal or external customer in the form of a cloud computing service. As-a-Service offerings typically provide endpoints with which various customers interface. These endpoints are typically based on a set of APIs. One category of as-a-service offering is Platform as a Service (PaaS), where a service provider provisions, instantiates, runs, and manages a modular bundle of code that customers can use to instantiate a computing platform and one or more applications, without the complexity of building and maintaining the infrastructure typically associated with these things. Another category is Software as a Service (SaaS) where software is centrally hosted and allocated on a subscription basis. SaaS is also known as on-demand software, web-based software, or web-hosted software. Four technological sub-fields involved in cloud services are: deployment, integration, on demand, and virtual private networks.

Figure 2:
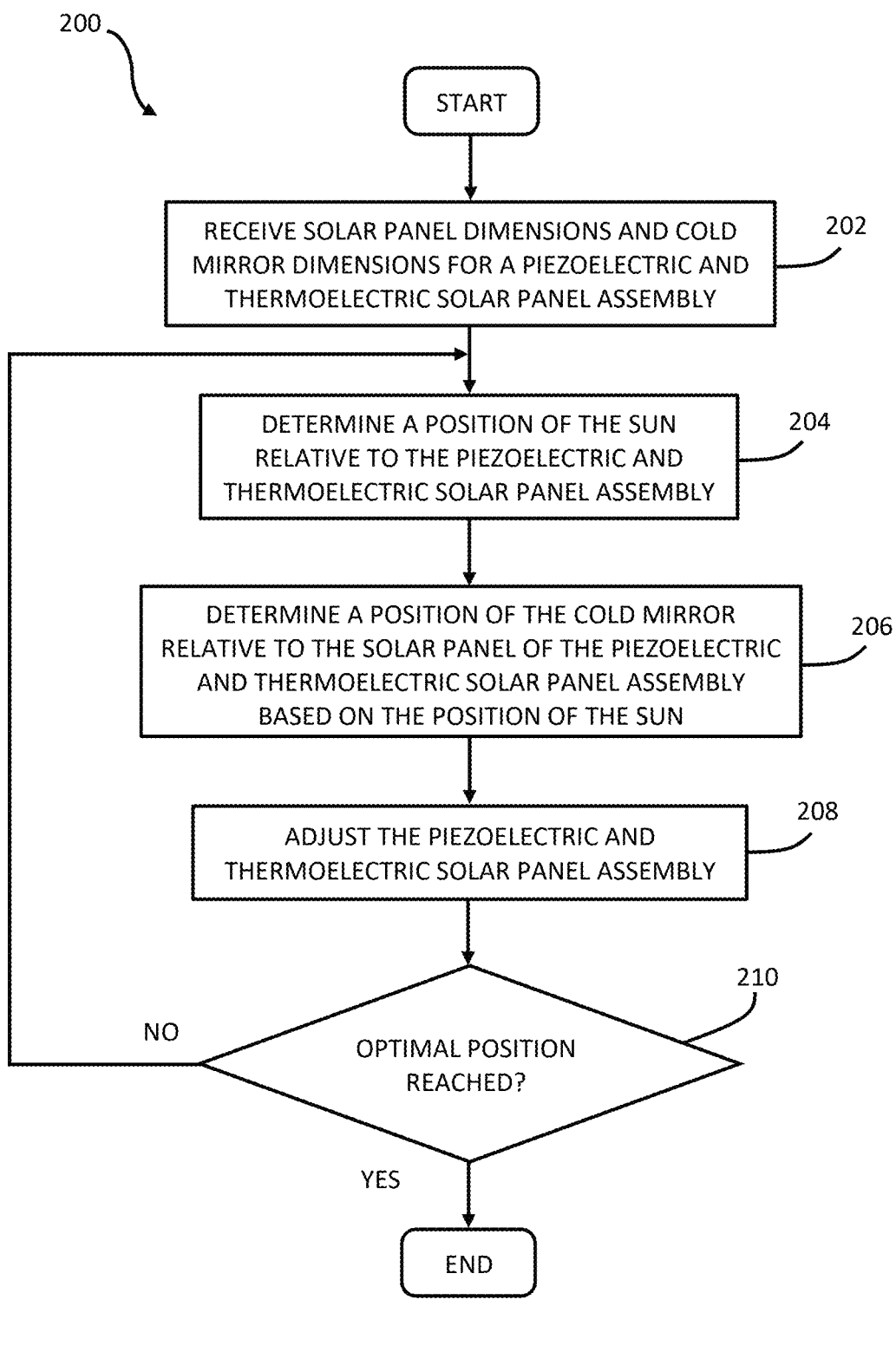
FIG. 2 depicts a flowchart of a solar panel configuration program for adjusting a piezoelectric and thermoelectric solar panel assembly, in accordance with an embodiment of the present invention.

FIG. 2 depicts a flowchart of a solar panel configuration program for adjusting a piezoelectric and thermoelectric solar panel assembly, in accordance with an embodiment of the present invention.

Solar panel configuration program 200 receives solar panel dimensions and cold mirror dimensions for a variable solar panel assembly (202). The solar panel assembly, also referred to as a piezoelectric and thermoelectric solar panel assembly, includes a solar panel and a cold mirror disposed over a support panel with an integrated thermoelectric generator and is discussed in further detail with regards to FIGS. 3 and 4. In this embodiment, the solar panel and the cold mirror have fixed dimensions, where at least one side of the solar panel is coupled to at least one side of the cold mirror via a hinge. The hinge allows for the movement of the cold mirror with respect to the solar panel or vice versa, where the hinge allows of the movement of the solar panel with respect to the cold mirror.

Solar panel configuration program 200 determines a position of the sun relative to the piezoelectric and thermoelectric solar panel assembly (204). Solar panel configuration program 200 utilizes a known position of the piezoelectric and thermoelectric solar panel assembly to determine a position of the sun (i.e., light source) relative to the known position of the piezoelectric and thermoelectric solar panel assembly. Specifically, a position of the cold mirror panel that is to reflect sunlight towards a top surface of the solar panel. In one embodiment, a piezoelectric and thermoelectric solar panel assembly is in a fixed positioned, where the solar panel (i.e., base) of the variable solar panel assembly remains in the fixed positioned. In another embodiment, a piezoelectric and thermoelectric solar panel assembly is mounted to a rotational platform, where the solar panel of the piezoelectric and thermoelectric solar panel assembly is mounted to the rotational platform allowing for the variable solar panel assembly to rotate 360 degrees. Solar panel configuration program 200 can utilizes the known location for the piezoelectric and thermoelectric solar panel assembly, a known time of the day, and a known travel path of the sun at the known location, to determine a current position of the sun relative to the piezoelectric and thermoelectric solar panel assembly.

Solar panel configuration program 200 determines a position of the cold mirror relative to the solar panel of the piezoelectric and thermoelectric solar panel assembly based on the position of the sun (206). Solar panel configuration program 200 determines a position of the cold mirror relative to the solar panel of the piezoelectric and thermoelectric solar panel assembly to optimize the position of the cold mirror to maximize sun reflection towards the solar panel, while minimizing an area of shade with no visible light created by the cold mirror. Solar panel configuration program 200 can utilize a net energy gain optimization formula (i.e., Equation A), provided below:

$$J = \text{Max} \cdot \sum\nolimits_{j=1}^{N} \left\{ w_S \cdot E_S\left(L_j, \delta_j^r\right) + w_T \cdot E_T\left(T_j, T_{amb,j}, \delta_j^r\right) + \right. \quad \text{Equation (A)}$$
$$\left. w_T \cdot E_v\left(V_j, \delta_j^r\right) - w_L \cdot E_L\left(\delta_j^r, \delta_c^*\right) \right) - \sum\nolimits_{i=1}^{N} w_{uP_i}\left(\delta_j^r - \delta_c^*\right)^2 \right\}$$

The net energy gain optimization formula is subject to the cold mirror angle restraints, $$\delta_j^{min} \le \delta_j \le \delta^{max},$$

photovoltaic (PV) irradiance constraints, $$L_j^{min} \le L_j \le L_j^{max},$$

thermoelectric generator temperature constraints, $$T_j^{min} \le T_j \le T_j^{max},$$

and piezoelectric vibrational energy constraints, $$V_j \leq V_j^{max}.$$

For the net energy gain optimization formula, J represents a cost function for total energy gain, $$\delta_j^r$$

represents an optimal cold mirror angle for the instant j, $$\delta_c^*$$

represents a selected cold mirror angle for instant c, $E_S$ represents an energy gain from solar energy which is proportional to irradiance ($L_j$) and a cold mirror angle-a photovoltaic characteristic profile, $E_T$ represents energy gain from the thermoelectric generator which is proportional to irradiance ($L_j$) and a cold mirror angle—a thermoelectric characteristics profile, $E_V$ represents energy gain from piezoelectric generator which is proportional to vibrational frequency ($V_j$) and a cold mirror angle—a vibrational characteristic profile, $E_L$ represents energy lost in changing a cold mirror angle, $w_G$, $w_T$, $w_L$ represent respective weighing coefficients for solar, thermoelectric, and energy lost, and $T_j$ represents a thermoelectric temperature as a function of absorbed infrared and ultraviolet spectrum frequency by the cold mirror.

Solar panel configuration program 200 adjusts the piezoelectric and thermoelectric solar panel assembly (208). Based on the net energy gain optimization formula, solar panel configuration program 200 adjusts the piezoelectric and thermoelectric solar panel assembly by altering an angle between the cold mirror and the solar panel of the piezoelectric and thermoelectric solar panel assembly. In addition to altering an angle between the cold mirror and the solar panel of the piezoelectric and thermoelectric solar panel assembly, solar panel configuration program 200 can adjust a rotational platform on which the piezoelectric and thermoelectric solar panel assembly is mounted to direct the cold mirror of the piezoelectric and thermoelectric solar panel assembly towards the sun. Solar panel configuration program 200 adjusts the piezoelectric and thermoelectric solar panel assembly based on limitations defined for an operational range constrained by the fixed dimensions for the solar panel and the cold mirror.

Solar panel configuration program 200 determines whether an optimal position for the piezoelectric and thermoelectric solar panel assembly is reached (decision 210). The optimal position for the piezoelectric and thermoelectric solar panel assembly is based on limitations (i.e., maximum position and minimum position) for an operational range defined by the fixed dimensions for the solar panel and the cold mirror. In the event solar panel configuration program 200 determines the optimal position for the piezoelectric and thermoelectric solar panel assembly was not reached ("no" branch, decision 210), solar panel configuration program 200 reverts to determining a position of the sun relative to the piezoelectric and thermoelectric solar panel assembly. In the event solar panel configuration program 200 determines the optimal position for the piezoelectric and thermoelectric solar panel assembly was reached ("yes" branch, decision 210), solar panel configuration program 200 ceases operations and places the piezoelectric and thermoelectric solar panel assembly into a standby mode.

Figure 3:
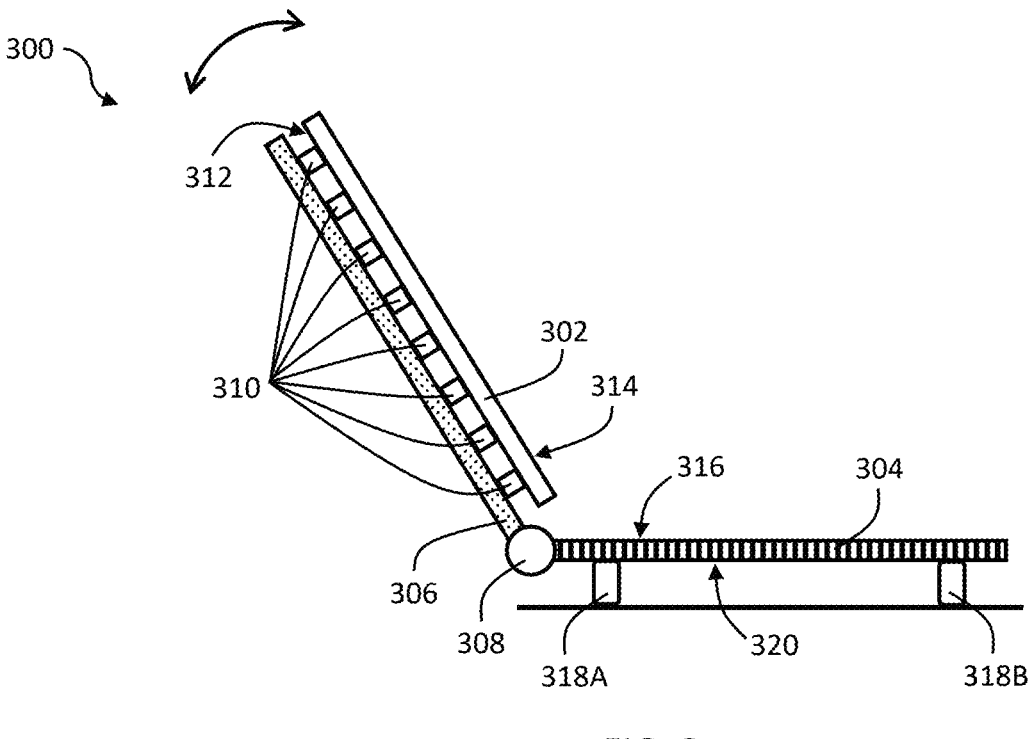
FIG. 3 depicts a side view of a piezoelectric and thermoelectric solar panel assembly, in accordance with an embodiment of the present invention.

FIG. 3 depicts a side view of a piezoelectric and thermoelectric solar panel assembly, in accordance with an embodiment of the present invention. Piezoelectric and thermoelectric solar panel assembly 300 includes cold mirror 302 for directing visible light towards solar panel 304, where cold mirror 302 is disposed above support panel 306. Hinge 308 is coupled to solar panel 304 and support panel 306, where support panel 306 with cold mirror 302 can rotate about hinge 308 with respect to a fixed solar panel 304. Cold mirror 302 is coupled to support panel 306 utilizing multiple piezoelectric generator assemblies 310. An enhance view of a single piezoelectric generator assembly 310 is discussed in further detail with regards to FIG. 5. In this embodiment, support panel 306 includes an integrated thermoelectric generator for capturing infrared and/or ultraviolet frequencies that pass through cold mirror 302. In other embodiments, the integrated thermoelectric generator is integrated into lower portion 312 of cold mirror 302, between cold mirror 302 and the multiple piezoelectric generator assemblies 310. The integrated thermoelectric generator of support panel 306 is discussed in further detail with regards to FIG. 5.

Cold mirror 302 disposed on support panel 306 is coupled to hinge 308, where support panel 306 rotates about hinge 308 to reflect visible light off of top portion 314 of cold mirror 302 towards upper surface 316 of solar panel 304. As previously discussed with respect to FIG. 2, solar panel configuration program 200 utilizes a net energy gain optimization formula to determine an angle between support panel 306 with cold mirror 302 and solar panel 304. Solar panel 304 is fixed in position with support beams 318A and 318B coupled to lower surface 320 of solar panel 304. In another embodiment, solar panel 304 is coupled to a rotatable platform (not illustrated in FIG. 3) capable of rotating in a manner such that top portion 314 of cold mirror 302 is directed towards the sun. The rotatable platform is discussed in further detail with regards to FIG. 4.

Figure 4:
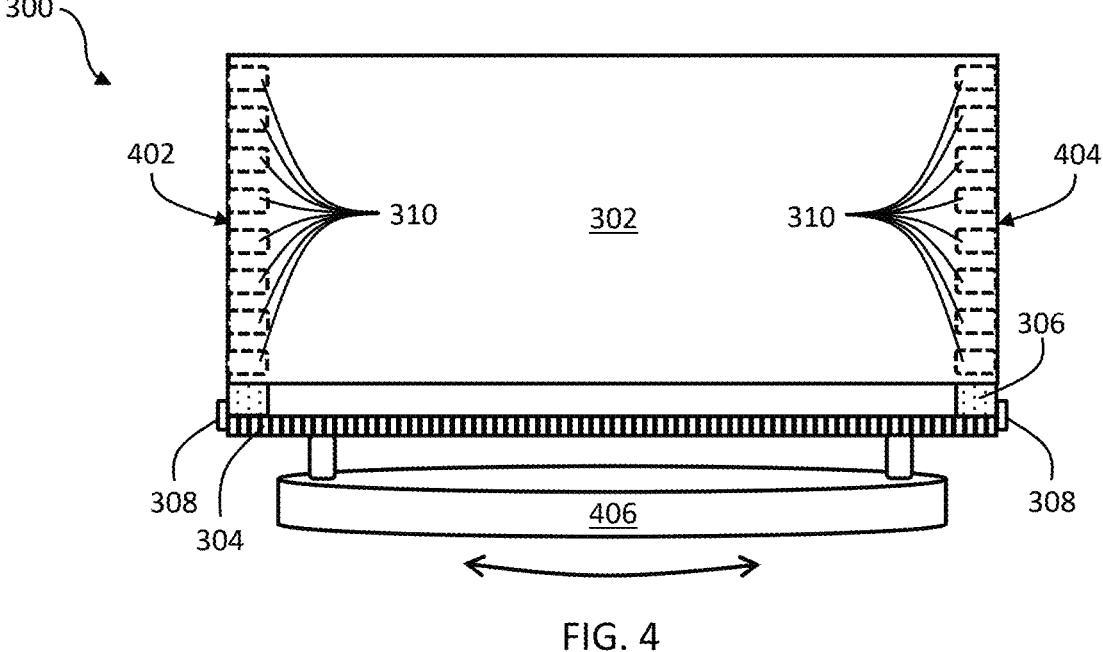
FIG. 4 depicts a front view of a piezoelectric and thermoelectric solar panel assembly, in accordance with an embodiment of the present invention.

FIG. 4 depicts a front view of a piezoelectric and thermoelectric solar panel assembly, in accordance with an embodiment of the present invention. In this embodiment, support panel 306 with cold mirror 302 is coupled to solar panel 304 with a first hinge 308 located on first side 402 of piezoelectric and thermoelectric solar panel assembly 300 and a second hinge 308 located on second side 404 opposite the first side of piezoelectric and thermoelectric solar panel assembly 300. A first set of multiple piezoelectric generator assemblies 310 are located on first side 402 of piezoelectric and thermoelectric solar panel assembly 300 and a second set of multiple piezoelectric generator assemblies 310 are located on second side 404 of piezoelectric and thermoelectric solar panel assembly 300. For discussion purposes, first side 402 and second side 404 of piezoelectric and thermoelectric solar panel assembly 300 also respectively correspond to first side 402 and second side 404 of cold mirror 302, solar panel 304, and support panel 306. Cold mirror 302 is disposed on support panel 306, where the first set and the second set of multiple piezoelectric generator assemblies 310 are positioned between cold mirror 302 and support panel 306. In this embodiment, piezoelectric and thermoelectric solar panel assembly 300 is coupled to rotatable platform 406 capable of rotating in a manner where cold mirror 302 is directed towards the sun to reflect light towards solar panel 304.

Figure 5:
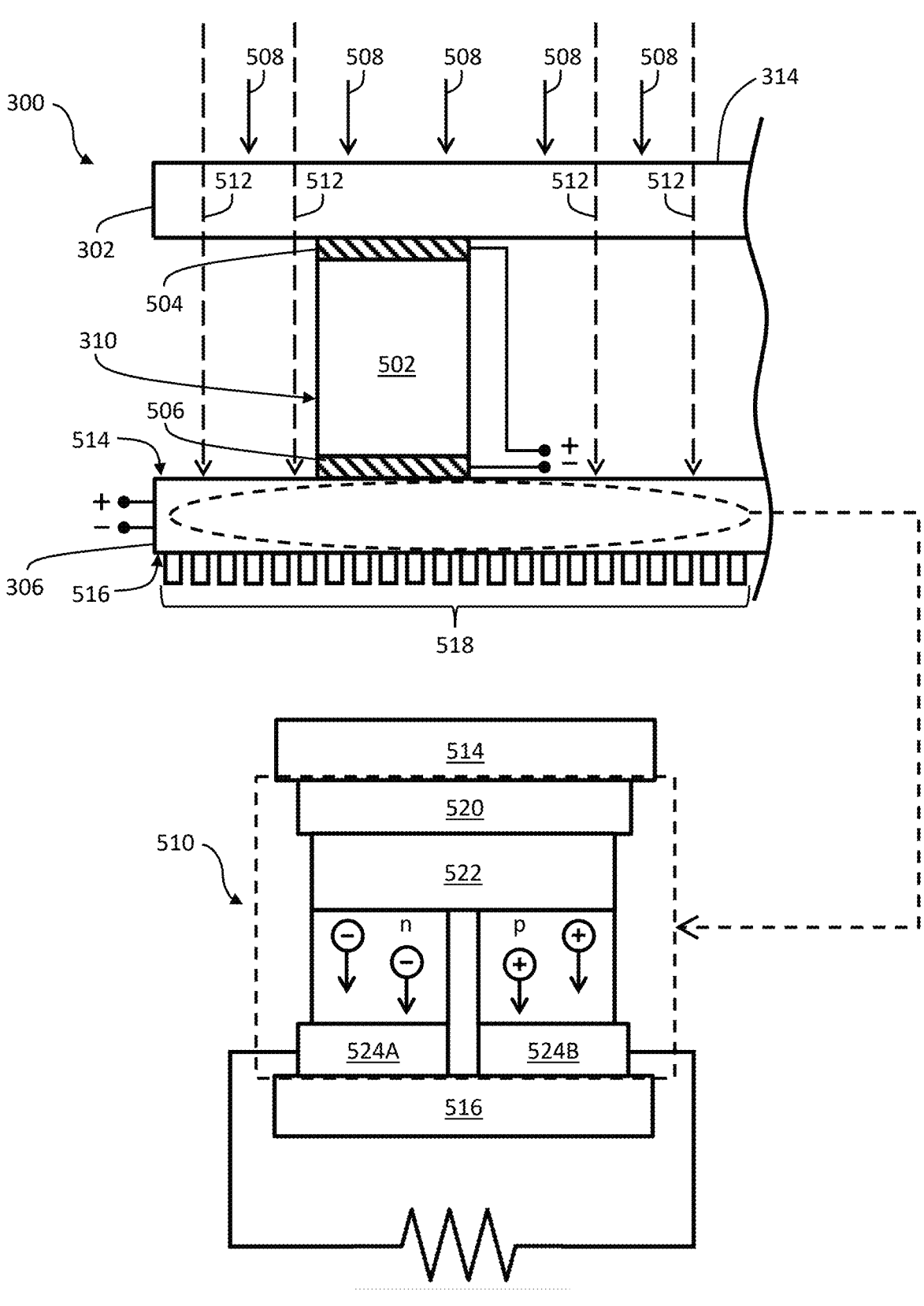
FIG. 5 depicts an enhanced side view of a piezoelectric and thermoelectric solar panel assembly with an integrated piezoelectric generator and thermoelectric generator, in accordance with an embodiment of the present invention.

FIG. 5 depicts an enhanced side view of a piezoelectric and thermoelectric solar panel assembly with an integrated piezoelectric generator and thermoelectric generator, in accordance with an embodiment of the present invention. In this enhanced side view of piezoelectric and thermoelectric solar panel assembly 300, a single piezoelectric generator assembly 310 is illustrated. Piezoelectric generator assembly 310 includes piezoelectric material 502 disposed between top metal plate 504 and bottom metal plate 506. Piezoelectric material 502 is a dielectric material that provides a conversion between electric and elastic energy, where the compression and rebound of piezoelectric material 502 due to wind flow 508 on top portion 314 of cold mirror 302 generates electrical energy. For a configuration of piezoelectric and thermoelectric solar panel assembly 300 as illustrated in FIG. 3, wind flow 508 impacts top portion 314 resulting a compression force being transferred to piezoelectric material 502 of piezoelectric generator assembly 310 due to support panel 306 remaining in a fixed position. The compression force results in a vibrational energy occurring in piezoelectric material 502 between top metal plate 504 and bottom metal plate 506.

In this embodiment, support panel 306 includes an integrated thermoelectric generator for generating electrical energy referred to as thermoelectric power generation (TEPG) module 510. Due to the properties of cold mirror 302, infrared and ultraviolent rays 512 passthrough cold mirror 302 towards upper region 514 of support panel 306. Support panel 306 includes a hollow volume in which TEPG module 510 is disposed between upper region 514 and lower region 516 of support panel 306. In this embodiment, lower region 516 includes heat sink 518 with multiple cooling fin structures. In other embodiment, lower region 516 does not include heat sink 518, since wind flow and/or an ambient temperature can provide cooling to a cooled portion of TEPG module 510. Heated surface of TEPG module 510 represents top region 514 where infrared and ultraviolent rays 512 impact support panel 306 (i.e., a heat source) and cooled surface of TEPG module 510 represents lower region 516 with heat sink 518. A temperature difference between upper region 514 of support panel 306 and lower region 516 of support panel 306 generates electrical energy through the Seebeck effect. In this embodiment, thermal conductive material 520 is present between the heat source and upper conductor 522 to facilitate heat transfer. Thermal conductive material 520 can be a thermal pad, a paste, and/or a thermal interface material (TIM) to ensure heat transfer between upper region 514 and upper conductor 522. N-type electrode is disposed between upper conductor 522 and lower conductor 524A (i.e., first lower conductor) and electrically coupled to upper conductor 522 and lower conductor 524A. P-type electrode is disposed between upper conductor 522 lower conductor 524B (i.e., second lower conductor) and electrically coupled to upper conductor 522 and lower conductor 524B.

Figure 6:
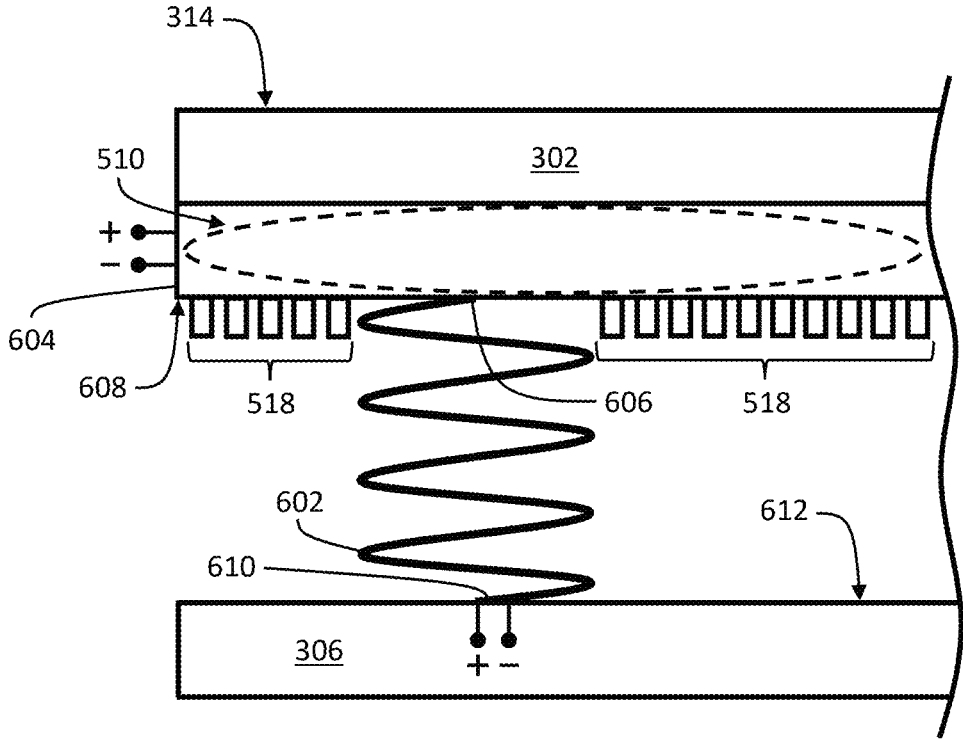
FIG. 6 depicts an enhanced side view of a piezoelectric and thermoelectric solar panel assembly with an integrated piezoelectric generator, thermoelectric generator, and spring, in accordance with an embodiment of the present invention.

FIG. 6 depicts an enhanced side view of a piezoelectric and thermoelectric solar panel assembly with an integrated piezoelectric generator, thermoelectric generator, and spring, in accordance with an embodiment of the present invention. In this embodiment, spring piezoelectric generator 602 is disposed between support panel 306 and cold mirror 302 with TEPG module housing 604. A cross-section of the structure of spring piezoelectric generator 602 includes a core electrode surrounded by a ferroelectric polymer that is surrounded by a surface electrode. Similar to piezoelectric generator assembly 310, spring piezoelectric generator 602 generates electrical energy through a compression and rebound motion due to wind flow on top portion 314 of cold mirror 302. First end 606 of spring piezoelectric generator 602 is coupled to lower portion 608 of TEPG module housing 604 and second end 610 of spring piezoelectric generator 602 is couple to upper portion 612 of support panel 306. In this embodiment, TEPG module 510 is disposed in a hollow volume of TEPG module housing 604 positioned beneath cold mirror 302. Heat sink 518 includes two portions positioned on a lower portion of TEPG module housing 604.

Embodiments of the present invention provide an apparatus for a piezoelectric and thermoelectric solar panel assembly that includes at least a solar panel, a cold mirror, and a support panel. The piezoelectric and thermoelectric solar panel assembly further includes at least a piezoelectric generator assembly disposed between the cold mirror and the support panel. The piezoelectric and thermoelectric solar panel assembly further includes at least a thermoelectric power generation module beneath the cold mirror. In some embodiments, the piezoelectric generator assembly as mentioned above is a spring piezoelectric generator. In some embodiments, a cross-section of a structure of the spring piezoelectric generator as mentioned above includes a core electrode surrounded by a ferroelectric polymer, where the ferroelectric polymer surrounded by a surface electrode. In some embodiments, the piezoelectric and thermoelectric solar panel assembly as mentioned above further includes a thermoelectric power generation module housing positioned beneath the cold mirror, wherein the thermoelectric power generation module is disposed within a hollow volume of the thermoelectric power generation module housing. In some embodiments, the piezoelectric and thermoelectric solar panel assembly further includes a first end of the spring piezoelectric generator coupled to a lower portion of the thermoelectric power generation module housing and a second end of the spring piezoelectric generator coupled to an upper portion of the support panel.

Embodiments of the present invention provide the piezoelectric and thermoelectric solar panel assembly that further includes a piezoelectric material disposed between a top plate and a bottom plate, wherein the top plate is coupled to a lower region of the cold mirror and the bottom plate is coupled to an upper portion of the support panel. In some embodiments, the thermoelectric power generation module as mention above further includes a thermal conductive material between an upper region of the support panel and an upper conductor of the thermoelectric power generation module, an N-type electrode disposed between the upper conductor and a first lower conductor, and the N-type electrode electrically coupled to the upper conductor and the first lower conductor, and a P-type electrode disposed between the upper conductor and a second lower conductor, and the P-type electrode electrically coupled to the upper conductor and the second lower conductor. In some embodiments, the piezoelectric and thermoelectric solar panel assembly as mentioned above further includes the first lower conductor disposed between N-type electrode and a lower region of the support panel and the second lower conductor disposed between P-type electrode and the lower region of the support panel. In some embodiments, the piezoelectric and thermoelectric solar panel assembly as mentioned above further includes a heat sink with a plurality of cooling fin structures positioned on the lower region of the support panel.

Embodiments of the present invention provide the piezoelectric and thermoelectric solar panel assembly further includes an upper conductor disposed between an upper region of the support panel and both, an N-type electrode and P-type electrode, the N-type electrode disposed between the upper conductor and a first lower conductor, and the N-type electrode electrically coupled to the upper conductor and the first lower conductor, and the P-type electrode disposed between the upper conductor and a second lower conductor, and the P-type electrode electrically coupled to the upper conductor and the second lower conductor. In some embodiments, the piezoelectric and thermoelectric solar panel assembly further includes the first lower conductor disposed between N-type electrode and a lower region of the support panel and the second lower conductor disposed between P-type electrode and the lower region of the support panel. In some embodiments, the piezoelectric and thermoelectric solar panel assembly as mentioned above further includes a heat sink with a plurality of cooling fin structures positioned on the lower region of the support panel.

Embodiments of the present invention provide the piezoelectric and thermoelectric solar panel assembly that further includes a thermal conductive material between an upper region of the thermoelectric power generation module housing and an upper conductor of the thermoelectric power generation module, an N-type electrode disposed between the upper conductor and a first lower conductor, and the N-type electrode electrically coupled to the upper conductor and the first lower conductor, and a P-type electrode disposed between the upper conductor and a second lower conductor, and the P-type electrode electrically coupled to the upper conductor and the second lower conductor. In some embodiments, the piezoelectric and thermoelectric solar panel assembly as mentioned above further includes the first lower conductor disposed between N-type electrode and a lower region of the thermoelectric power generation module housing and the second lower conductor disposed between P-type electrode and the lower region of the thermoelectric power generation module housing. In some embodiments, the piezoelectric and thermoelectric solar panel assembly mentioned above further includes a heat sink with a plurality of cooling fin structures positioned on the lower region of the thermoelectric power generation module housing.

Embodiments of the present invention provide the piezoelectric and thermoelectric solar panel assembly that further includes an upper conductor disposed between an upper region of the thermoelectric power generation module housing and both, an N-type electrode and P-type electrode, the N-type electrode disposed between the upper conductor and a first lower conductor, and the N-type electrode electrically coupled to the upper conductor and the first lower conductor, and the P-type electrode disposed between the upper conductor and a second lower conductor, and the P-type electrode electrically coupled to the upper conductor and the second lower conductor. In some embodiments, the piezoelectric and thermoelectric solar panel assembly mentioned above further includes the first lower conductor disposed between N-type electrode and a lower region of the thermoelectric power generation module housing and the second lower conductor disposed between P-type electrode and the lower region of the thermoelectric power generation module housing. In some embodiments, the piezoelectric and thermoelectric solar panel assembly mentioned above further includes a heat sink with a plurality of cooling fin structures positioned on the lower region of the thermoelectric power generation module housing.

Embodiments of the present invention provide the piezoelectric and thermoelectric solar panel assembly that further includes a first hinge positioned on a first side of the piezoelectric and thermoelectric solar panel assembly, wherein a first side of the cold mirror is coupled to the first hinge and a first side of the solar panel is coupled to the first hinge. The piezoelectric and thermoelectric solar panel assembly that further includes a second hinge positioned on a second side of the piezoelectric and thermoelectric solar panel assembly; wherein a second side of the cold mirror is coupled to the second hinge and a second side of the solar panel is coupled to the second hinge.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus for a piezoelectric and thermoelectric solar panel assembly, the apparatus comprising:
   a solar panel, a cold mirror, and a support panel;
   a piezoelectric generator assembly disposed between the cold mirror and the support panel; and
   a thermoelectric power generation module beneath the cold mirror.

2. The apparatus of claim 1, wherein the piezoelectric generator assembly is a spring piezoelectric generator.

3. The apparatus of claim 2, where a cross-section of a structure of the spring piezoelectric generator further comprises:
   a core electrode surrounded by a ferroelectric polymer; and
   the ferroelectric polymer surrounded by a surface electrode.

4. The apparatus of claim 3, further comprises:
   a first end of the spring piezoelectric generator coupled to a lower portion of the cold mirror and a second end of the spring piezoelectric generator coupled to an upper portion of the support panel.

5. The apparatus of claim 3, further comprises:
   a thermoelectric power generation module housing positioned beneath the cold mirror, wherein the thermoelectric power generation module is disposed within a hollow volume of the thermoelectric power generation module housing.

6. The apparatus of claim 5, further comprises:
   a first end of the spring piezoelectric generator coupled to a lower portion of the thermoelectric power generation module housing and a second end of the spring piezoelectric generator coupled to an upper portion of the support panel.

7. The apparatus of claim 1, wherein the piezoelectric generator assembly further comprises:
   a piezoelectric material disposed between a top plate and a bottom plate, wherein the top plate is coupled to a lower region of the cold mirror and the bottom plate is coupled to an upper portion of the support panel.

8. The apparatus of claim 1, wherein the thermoelectric power generation module further comprises:
   a thermal conductive material between an upper region of the support panel and an upper conductor of the thermoelectric power generation module;

an N-type electrode disposed between the upper conductor and a first lower conductor, and the N-type electrode electrically coupled to the upper conductor and the first lower conductor; and a P-type electrode disposed between the upper conductor and a second lower conductor, and the P-type electrode electrically coupled to the upper conductor and the second lower conductor.

9. The apparatus of claim 8, further comprising:

the first lower conductor disposed between the N-type electrode and a lower region of the support panel; and the second lower conductor disposed between the P-type electrode and the lower region of the support panel.

10. The apparatus of claim 9, further comprising:

a heat sink with a plurality of cooling fin structures positioned on the lower region of the support panel.

11. The apparatus of claim 1, wherein the thermoelectric power generation module further comprises:

an upper conductor disposed between an upper region of the support panel and both, an N-type electrode and P-type electrode;

the N-type electrode disposed between the upper conductor and a first lower conductor, and the N-type electrode electrically coupled to the upper conductor and the first lower conductor; and the P-type electrode disposed between the upper conductor and a second lower conductor, and the P-type electrode electrically coupled to the upper conductor and the second lower conductor.

12. The apparatus of claim 11, further comprising:

the first lower conductor disposed between the N-type electrode and a lower region of the support panel; and the second lower conductor disposed between the P-type electrode and the lower region of the support panel.

13. The apparatus of claim 12, further comprising:

a heat sink with a plurality of cooling fin structures positioned on the lower region of the support panel.

14. The apparatus of claim 6, wherein the thermoelectric power generation module further comprises:

a thermal conductive material between an upper region of the thermoelectric power generation module housing and an upper conductor of the thermoelectric power generation module;

an N-type electrode disposed between the upper conductor and a first lower conductor, and the N-type electrode electrically coupled to the upper conductor and the first lower conductor; and a P-type electrode disposed between the upper conductor and a second lower conductor, and the P-type electrode electrically coupled to the upper conductor and the second lower conductor.

15. The apparatus of claim 14, further comprising:

the first lower conductor disposed between the N-type electrode and a lower region of the thermoelectric power generation module housing; and the second lower conductor disposed between the P-type electrode and the lower region of the thermoelectric power generation module housing.

16. The apparatus of claim 15, further comprising:

a heat sink with a plurality of cooling fin structures positioned on the lower region of the thermoelectric power generation module housing.

17. The apparatus of claim 6, wherein the thermoelectric power generation module further comprises:

an upper conductor disposed between an upper region of the thermoelectric power generation module housing and both, an N-type electrode and P-type electrode;

the N-type electrode disposed between the upper conductor and a first lower conductor, and the N-type electrode electrically coupled to the upper conductor and the first lower conductor; and the P-type electrode disposed between the upper conductor and a second lower conductor, and the P-type electrode electrically coupled to the upper conductor and the second lower conductor.

18. The apparatus of claim 17, further comprising:

the first lower conductor disposed between N-type electrode and a lower region of the thermoelectric power generation module housing; and the second lower conductor disposed between P-type electrode and the lower region of the thermoelectric power generation module housing.

19. The apparatus of claim 18, further comprising:

a heat sink with a plurality of cooling fin structures positioned on the lower region of the thermoelectric power generation module housing.

20. The apparatus of claim 1, further comprises:

a first hinge positioned on a first side of the piezoelectric and thermoelectric solar panel assembly, wherein a first side of the cold mirror is coupled to the first hinge and a first side of the solar panel is coupled to the first hinge; and a second hinge positioned on a second side of the piezoelectric and thermoelectric solar panel assembly; wherein a second side of the cold mirror is coupled to the second hinge and a second side of the solar panel is coupled to the second hinge.

* * * * *